US 9,809,881 B2

(12) United States Patent
Rogers et al.

(10) Patent No.: US 9,809,881 B2
(45) Date of Patent: Nov. 7, 2017

(54) METHOD AND APPARATUS FOR MULTIZONE PLASMA GENERATION

(75) Inventors: Matthew Scott Rogers, Mountain View, CA (US); Zhong Qiang Hua, Saratoga, CA (US); Christopher S. Olsen, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1540 days.

(21) Appl. No.: 13/192,870

(22) Filed: Jul. 28, 2011

(65) Prior Publication Data
US 2012/0208371 A1 Aug. 16, 2012

Related U.S. Application Data

(60) Provisional application No. 61/443,066, filed on Feb. 15, 2011.

(51) Int. Cl.
*C23C 16/455* (2006.01)
*C23C 16/46* (2006.01)
(Continued)

(52) U.S. Cl.
CPC ........ *C23C 16/513* (2013.01); *C23C 16/4584* (2013.01); *C23C 16/45565* (2013.01);
(Continued)

(58) Field of Classification Search
CPC .......... C23C 16/45565; C23C 16/4584; C23C 16/481; C23C 16/505; C23C 16/517;
(Continued)

(56) References Cited

U.S. PATENT DOCUMENTS 5,252,178 A 10/1993 Moslehi
5,662,819 A 9/1997 Kadomura
(Continued)

FOREIGN PATENT DOCUMENTS

CN 1965612 A 5/2007
CN 101303537 A 11/2008
(Continued)

OTHER PUBLICATIONS

Emilie Despiau-Pujo et al., "Simulations of Radical and Ion Fluxes on a Wafer in a Cl2/Ar Inductively Coupled Plasma Discharge: Confrontation with GaAs and GaN Etch Experiments." J. Vac. Soc. Technol. B 28(4), Jul./Aug. 2010, pp. 693-701.
(Continued)

*Primary Examiner* — Maliheh Malek
(74) *Attorney, Agent, or Firm* — Patterson + Sheridan, LLP

(57) ABSTRACT

Embodiments of the present invention provide a method and apparatus for plasma processing a substrate to form a film on the substrate and devices disposed thereon by controlling the ratio of ions to radicals in the plasma at a given pressure. A given pressure may be maintained to promote ion production using one plasma source, and a second plasma source may be used to provide additional radicals. In one embodiment, a low pressure plasma is generated in a processing region having the substrate positioned therein, and a high pressure plasma is generated in separate region. Radicals from the high pressure plasma are injected into the processing region having the low pressure plasma, thus, altering the natural distribution of radicals to ions at a given operating pressure. The resulting process and apparatus enables tailoring of the ion to radical ratio to allow better control of forming films on high aspect ratio features, and thus improve corner
(Continued)

rounding, conformality of sidewall to bottom trench growth, and selective growth.

16 Claims, 4 Drawing Sheets

(51) Int. Cl.
  *C23C 16/505* (2006.01)
  *C23C 16/513* (2006.01)
  *C23C 16/458* (2006.01)
  *C23C 16/48* (2006.01)
  *C23C 16/517* (2006.01)
  *H01J 37/32* (2006.01)

(52) U.S. Cl.
  CPC .......... *C23C 16/481* (2013.01); *C23C 16/505* (2013.01); *C23C 16/517* (2013.01); *H01J 37/321* (2013.01); *H01J 37/3244* (2013.01); *H01J 37/32357* (2013.01)

(58) Field of Classification Search
  CPC ... C23C 16/513; H01J 37/3244; H01J 37/321; H01J 37/32357
  USPC .... 118/715, 719, 723 MP, 723 ME, 723 AN, 118/723 ER, 723 I, 723 IR, 724–725; 257/E21.282, E21.283; 438/770, 771, 438/787–788
  See application file for complete search history.

(56) References Cited

U.S. PATENT DOCUMENTS

| | | | | |
|---|---|---|---|---|
| 6,727,134 | B1* | 4/2004 | Chen ................ | H01L 21/28202 257/E21.639 |
| 6,821,910 | B2 | 11/2004 | Adomaitis et al. | |
| 7,510,624 | B2* | 3/2009 | Liang et al. ............ | 156/345.33 |
| 7,645,357 | B2* | 1/2010 | Paterson ............ | H01J 37/32165 156/345.51 |
| 7,780,864 | B2* | 8/2010 | Paterson ............ | H01J 37/32091 216/59 |
| 7,807,579 | B2* | 10/2010 | Yang ................ | H01L 21/02063 216/63 |
| 7,972,968 | B2* | 7/2011 | Lee et al. ................ | 438/711 |
| 8,043,981 | B2* | 10/2011 | Ma et al. .................. | 438/788 |
| 8,236,706 | B2* | 8/2012 | Peuse et al. ............ | 438/770 |
| 8,368,308 | B2* | 2/2013 | Banna ................ | H01J 37/321 315/111.71 |
| 8,435,906 | B2* | 5/2013 | Tjandra et al. ............ | 438/770 |
| 8,980,382 | B2* | 3/2015 | Ingle .................... | C23C 16/308 427/563 |
| 2001/0021592 | A1* | 9/2001 | Lee et al. ................ | 438/783 |
| 2001/0029891 | A1* | 10/2001 | Oh ...................... | C23C 16/403 118/722 |
| 2002/0000202 | A1 | 1/2002 | Yuda et al. | |
| 2002/0052124 | A1* | 5/2002 | Raaijmakers et al. ........ | 438/778 |
| 2003/0013314 | A1* | 1/2003 | Ying ................ | H01J 37/32862 438/710 |
| 2003/0029567 | A1* | 2/2003 | Dhindsa ............ | H01J 37/32082 156/345.47 |
| 2003/0085205 | A1* | 5/2003 | Lai .................... | H01J 37/32431 219/121.43 |
| 2003/0143328 | A1* | 7/2003 | Chen .................... | C23C 16/06 427/255.28 |
| 2004/0000321 | A1* | 1/2004 | Cui .................... | C23C 16/4405 134/1.2 |
| 2004/0161535 | A1* | 8/2004 | Goundar ............ | C23C 16/325 427/249.15 |
| 2004/0161536 | A1* | 8/2004 | Lang et al. ............ | 427/255.28 |
| 2005/0191827 | A1* | 9/2005 | Collins ............ | H01J 37/32082 438/513 |
| 2005/0191830 | A1* | 9/2005 | Collins ............ | H01J 37/32082 438/514 |
| 2005/0224181 | A1* | 10/2005 | Merry ............... | H01J 37/32357 156/345.35 |
| 2006/0040483 | A1* | 2/2006 | Niimi et al. .................. | 438/591 |
| 2006/0154494 | A1 | 7/2006 | Qi et al. | |
| 2006/0172550 | A1* | 8/2006 | Chua ............................ | 438/770 |
| 2006/0172551 | A1* | 8/2006 | Chua ............................ | 438/770 |
| 2006/0223315 | A1* | 10/2006 | Yokota et al. ................ | 438/689 |
| 2006/0226119 | A1* | 10/2006 | Kannan ................ | B08B 7/0035 216/67 |
| 2006/0251795 | A1* | 11/2006 | Kobrin .................... | A61L 27/34 427/2.1 |
| 2006/0266288 | A1* | 11/2006 | Choi .................... | C23C 16/4405 118/715 |
| 2008/0011426 | A1* | 1/2008 | Chua ........................ | 156/345.48 |
| 2008/0050932 | A1* | 2/2008 | Lakshmanan et al. ........ | 438/786 |
| 2008/0115801 | A1* | 5/2008 | Chin .................... | C23C 16/4405 134/1.2 |
| 2008/0179289 | A1* | 7/2008 | Collins et al. .................. | 216/67 |
| 2008/0179290 | A1* | 7/2008 | Collins et al. .................. | 216/67 |
| 2008/0179291 | A1* | 7/2008 | Collins et al. .................. | 216/67 |
| 2008/0305246 | A1* | 12/2008 | Choi et al. ...................... | 427/74 |
| 2009/0000551 | A1* | 1/2009 | Choi et al. ................ | 118/723 R |
| 2009/0017227 | A1* | 1/2009 | Fu et al. ......................... | 427/569 |
| 2009/0084501 | A1 | 4/2009 | Chen et al. | |
| 2009/0095714 | A1* | 4/2009 | Chen .................... | H01J 37/321 216/67 |
| 2009/0098276 | A1* | 4/2009 | Burrows ............ | C23C 16/45565 427/8 |
| 2009/0104732 | A1* | 4/2009 | White ............... | 438/96 |
| 2009/0104755 | A1 | 4/2009 | Mallick et al. | |
| 2009/0280650 | A1* | 11/2009 | Lubomirsky ............. | B08B 7/00 438/694 |
| 2009/0289179 | A1 | 11/2009 | Chen et al. | |
| 2009/0314309 | A1* | 12/2009 | Sankarakrishnan ...... | B08B 5/00 134/1.1 |
| 2010/0098882 | A1* | 4/2010 | Lubomirsky et al. ........ | 427/569 |
| 2010/0216317 | A1 | 8/2010 | Tjandra et al. | |
| 2010/0227420 | A1* | 9/2010 | Banna ................ | H01J 37/321 438/10 |
| 2010/0267247 | A1* | 10/2010 | Ma et al. ...................... | 438/765 |
| 2010/0330814 | A1 | 12/2010 | Yokota et al. | |
| 2011/0033638 | A1* | 2/2011 | Ponnekanti et al. .......... | 427/569 |
| 2011/0045676 | A1* | 2/2011 | Park et al. ...................... | 438/771 |
| 2011/0061812 | A1* | 3/2011 | Ganguly ............ | H01L 21/0223 156/345.34 |
| 2011/0189860 | A1* | 8/2011 | Porshnev .......... | H01J 37/32412 438/761 |
| 2011/0212274 | A1* | 9/2011 | Selsley ................ | C23C 14/5826 427/540 |
| 2011/0256645 | A1* | 10/2011 | Tam .................... | C23C 16/45519 438/14 |
| 2011/0265814 | A1* | 11/2011 | Cruse et al. ................... | 134/1.1 |
| 2011/0265884 | A1* | 11/2011 | Xu et al. ......................... | 137/14 |
| 2011/0265951 | A1* | 11/2011 | Xu et al. ................ | 156/345.26 |
| 2011/0266256 | A1* | 11/2011 | Cruse et al. ................... | 216/59 |
| 2011/0298099 | A1* | 12/2011 | Lee et al. ....................... | 257/632 |
| 2012/0000490 | A1* | 1/2012 | Chung ................ | B08B 7/0035 134/22.12 |
| 2012/0070590 | A1* | 3/2012 | Huang ............... | C23C 16/45551 427/532 |
| 2012/0103264 | A1* | 5/2012 | Choi et al. ..................... | 118/728 |
| 2012/0103524 | A1* | 5/2012 | Chebi et al. ............. | 156/345.48 |
| 2012/0171852 | A1* | 7/2012 | Yuan .................... | C23C 16/24 438/488 |
| 2012/0208371 | A1* | 8/2012 | Rogers et al. ................ | 438/758 |
| 2012/0217221 | A1* | 8/2012 | Hoffman ............... | C23C 14/345 216/61 |

FOREIGN PATENT DOCUMENTS

| | | |
|---|---|---|
| CN | 101473426 A | 7/2009 |
| CN | 101921998 A | 12/2010 |
| JP | H08167596 A | 6/1996 |
| KR | 10-0433006 | 5/2004 |
| KR | 10-0580584 | 5/2006 |
| KR | 10-0725037 | 6/2007 |
| KR | 10-0855597 | 9/2008 |

(56) References Cited

FOREIGN PATENT DOCUMENTS

OTHER PUBLICATIONS

Takuya Sugaware et al., "Characterization of Ultra Thin Oxynitride Formed by Radical Nitridation with Slot Plane Antenna Plasma." Japanese Journal of Applied Physics, vol. 44, No. 3, 2005, pp. 1232-1236.
International Search Report and Written Opinion dated Mar. 2, 2012 for PCT Application No. PCT/US2011/045626. (APPM/015221PCTP).
Official letter from Chinese Patent Office dated Jun. 2, 2016 for corresponding Chinese Patent Application No. 201180067134X.
Official letter from Chinese Patent Office dated Jun. 2, 2015 for corresponding Chinese Patent Application No. 201180067134X.
Office Action from Chinese Patent Application Serial No. 201180067134.X dated Nov. 9, 2016.

* cited by examiner

METHOD AND APPARATUS FOR MULTIZONE PLASMA GENERATION

CROSS-REFERENCE TO RELATED APPLICATIONS

This application claims benefit of U.S. provisional patent application Ser. No. 61/443,066, filed Feb. 15, 2011, which is herein incorporated by reference.

BACKGROUND OF THE INVENTION

Field of the Invention

Embodiments of the present invention generally relate to a method and apparatus for plasma processing of substrates, and more particularly, to film formation on a substrate or devices disposed thereon by controlling the ratio of ions and radicals in the plasma using multizone plasma generation.

Description of the Related Art

As logic devices continue to scale down according to Moore's Law, processing challenges develop. As critical dimensions of such devices shrink, the geometry of the various components becomes more challenging for manufacturers. Aspect ratios rise and uniformity, tolerance, and reliability issues proliferate. Additionally, issues involving corner rounding, bottom to side trench growth conformality, and selective growth, which are affected by the natural distribution of ions and radicals within plasma at a given pressure, are prominent. Therefore, methods and apparatus for tailoring the ion to radical ratio in plasma at a given pressure is needed to overcome scaling challenges particular to logic devices.

SUMMARY OF THE INVENTION

In one embodiment of the present invention, a method for forming a film on a substrate comprises generating a first plasma from a first gas in a processing region of a processing chamber at a first pressure, generating a second plasma from a second gas outside of the processing region at a second pressure, introducing a flow of the second plasma into the processing region to mix with the first plasma, and heating the substrate positioned on a substrate support within the processing region.

In another embodiment, a reactor for forming a film on a substrate comprises a processing chamber having a lid, a sidewall, and a substrate support positioned to form a processing region, a gas source coupled to the chamber and configured to deliver a process gas to the processing region, an RF source coupled to the processing chamber and configured to generate a first plasma of the process gas in the processing region, a remote plasma source coupled to the chamber and configured to deliver a second plasma generated at a first pressure to the processing region to mix with the first plasma, and a vacuum pump coupled to the processing chamber and configured to maintain the processing region at a second pressure, wherein the first pressure is greater than the second pressure. The substrate support includes a heater configured to heat a substrate disposed on the substrate support to a temperature of at least about 500° C.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a method and apparatus for plasma processing a substrate to form a film on the substrate and devices disposed thereon by controlling the ratio of ions to radicals in the plasma at a given pressure. A given pressure may be maintained to promote ion production using one plasma source, and a second plasma source may be used to provide additional radicals. In one embodiment, a low pressure plasma is generated in a processing region having the substrate positioned therein, and a high pressure plasma is generated in separate region. Radicals from the high pressure plasma are injected into the processing region having the low pressure plasma, thus, altering the natural distribution of radicals to ions at a given operating pressure. The resulting process and apparatus enables tailoring of the ion to radical ratio to allow better control of forming films on high aspect ratio features, and thus improve corner rounding, conformality of sidewall to bottom trench growth, and selective growth.

Figure 1:
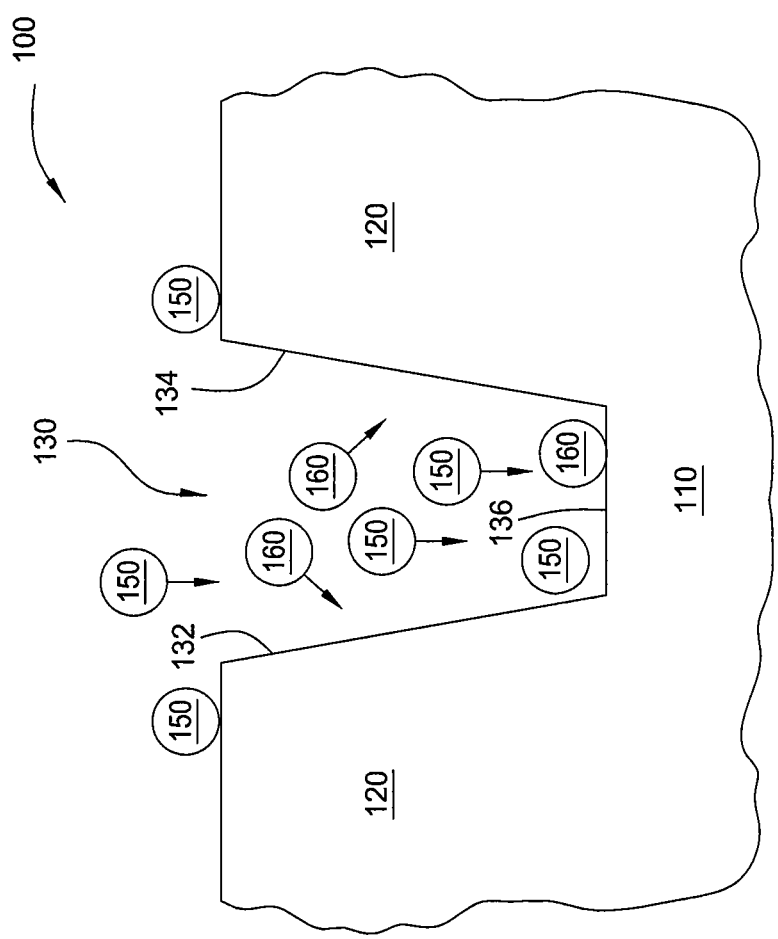
FIG. 1 is a schematic, cross-sectional view of a semiconductor structure.

FIG. 1 is a schematic, cross-sectional view of a semiconductor structure 100. The structure 100 may include a substrate 110 having a plurality of features 120 disposed thereon. The substrate 110 may comprise a material such as crystalline silicon, silicon oxide, silicon germanium, doped or undoped polysilicon, doped or undoped silicon wafers, patterned or non-patterned silicon wafers, carbon doped silicon oxides, silicon nitride, gallium arsenide, glass, sapphire, or the like.

In one embodiment, the features 120 are film stacks needing a film formed thereover, such as an oxide or nitride. For instance, the features 120 may be a gate stack of a flash memory cell comprising one or more of a tunnel oxide layer, a floating gate layer, a single or multi-layer dielectric layer, and a control gate layer.

The features 120 may be high aspect ratio features forming trenches 130 therebetween. Each trench 130 is defined by sidewalls 132, 134, and a bottom wall 136. When forming a film on the structure 100 having high aspect ratio features 120, it is difficult to maintain conformal growth on the sidewalls 132, 134 and the bottom wall 136. Additionally, corner rounding is beneficial to prevent sharp corners on the features 120 as well as prevent "pinching off" of the film being grown on the features 120 at the top side of the trench 130.

When plasma processing the structure 100 at a desired pressure, a given number of ions 150 (i.e., charged atoms) and radicals 160 (i.e., neutral atoms) are produced. That is, the ratio of ions 150 to radicals 160 is dependent on pressure. The directionality of the ions 150 and radicals 160 has been found to be dependent on the pressure used as well. For instance, a low pressure (e.g., less than 500 mTorr) is desirable to allow growth on bottom features, such as the bottom wall 136, because when the processing pressure is high, the ions 150 and radicals 160 collide and are forced to the sidewalls 132, 134, and do not reach the bottom wall 136.

However, due to their natural charge, the ions 150 in the low pressure plasma are accelerated toward the substrate 110, which has a bias applied thereto. This acceleration results in greater film growth at the bottom wall 136 than the sidewalls 132, 134. Thus, the ions 150 exhibit directionality based on both vias and pressure, while the radicals 160, being neutral, do not exhibit the same directionality. Therefore, in some embodiments it is desirable to increase the number of radicals 160 in the processing region without raising the pressure in order to better control conformality and corner rounding when growing a film on a high aspect ratio feature.

Figure 2A:
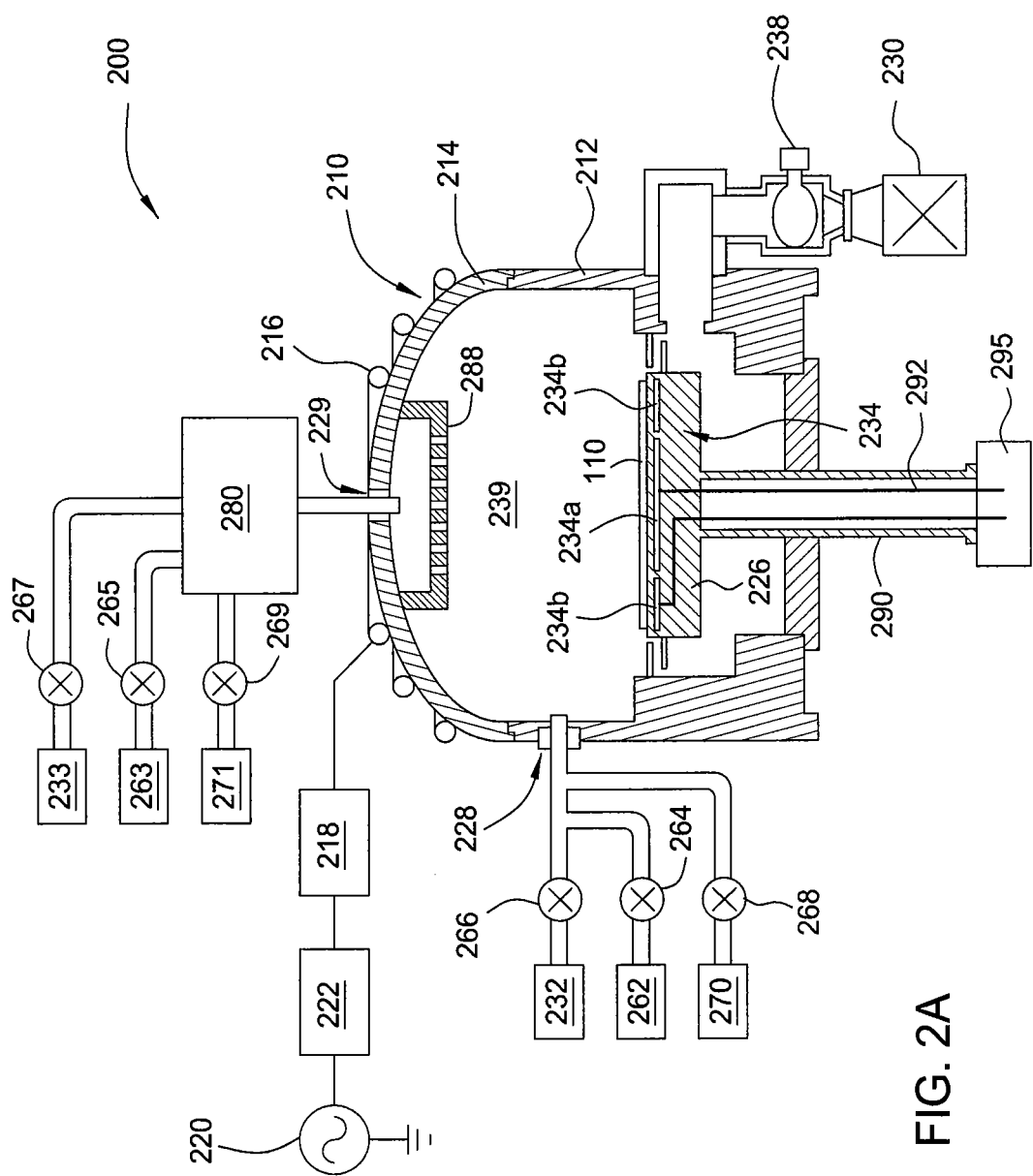
FIG. 2A is a schematic, cross-sectional view of a reactor according to one embodiment.

FIG. 2A is a schematic, cross-sectional view of a reactor 200 according to one embodiment of the present invention. The reactor includes a chamber 210 having a cylindrical side wall 212 and a ceiling 214, which may be either dome-shaped (as shown), flat, or another geometry. A plasma source power applicator having a coil antenna 216 may be disposed over the ceiling 214 and coupled through a first impedance match network 218 to a power source. The power source may have an RF power generator 220 and a gate 222 at the output of the power generator 220.

The reactor 200 may also include a substrate support pedestal 226, which may be an electrostatic chuck or other suitable substrate support, for holding a substrate 110, such as a 200 mm or 300 mm wafer or the like. A heater 234 is disposed within the substrate support pedestal 226. The heater 234 may be a single or multiple zone heater, such as a dual radial zone heater having radial inner and outer heating elements 234a and 234b, as depicted in FIG. 2A. In one embodiment, the heater 234 is configured to heat the substrate 110 to a temperature of about 500° C. or greater, such as about 700° C. or greater.

The substrate support pedestal 226 is supported by a stem 290. The stem 290 houses wiring 292 for the heater 234 as well as electrodes (not shown) positioned within the pedestal 226 for applying a bias to the substrate 110 for processing (e.g., capacitive plasma processing) and/or for chucking the substrate 110. In one embodiment, an actuator assembly 295 is attached to the stem 290 and is configured to rotate the pedestal 226, and in turn, the substrate 110 positioned thereon, during processing to provide more uniform processing, particularly if the processing configuration shown in FIG. 2B (subsequently described below) is used.

In addition, the reactor 200 includes a gas injection system 228 and a vacuum pump 230 coupled to the interior of the chamber 210. The gas injection system 228 is supplied by a gas source, which may include an oxygen container 232, a hydrogen container 262, and/or a nitrogen container 270. Other process gas sources may be included, such as a water vapor source and an inert gas source (not shown). Flow control valves 266, 264, and 268 may be coupled to the oxygen container 232, the hydrogen container 262, and the nitrogen container 270, respectively, and may be utilized to selectively provide process gases or process gas mixtures to a processing region 239 of the chamber 210 during processing. Other gas sources (not shown) for providing additional gases or gas mixtures may also be provided. The pressure inside the chamber 210 may be controlled by a throttle valve 238 of the vacuum pump 230. In one embodiment, the vacuum pump 230 and throttle valve 238 are configured to control the pressure inside the chamber 210 to a pressure of about 500 mTorr or less, such as about 150 mTorr or less.

An additional gas injection system 229 is fluidly coupled to a remote plasma source 280, such as a microwave, capacitively coupled, or inductively coupled remote plasma source. In one embodiment, the remote plasma source is configured to generate plasma at a pressure of about 1 Torr or greater. The gas injection system 229 is supplied by a gas source, which may include an oxygen container 233, a hydrogen container 263, and/or a nitrogen container 271. Flow control valves, 267, 265, and 269 may be coupled to the oxygen container 233, the hydrogen container 263, and the nitrogen container 271, respectively, and may be utilized to selectively provide process gases or process gas mixtures to the remote plasma source 280.

In one embodiment, as shown in FIG. 2A, the gas injection system 229 includes a showerhead 288 having a plurality of orifices for uniformly introducing plasma from the remote plasma source 280 into the processing region 239 of the chamber 210. However, the plasma may instead be introduced through a single orifice 289 as shown in FIG. 2B.

Figure 2B:
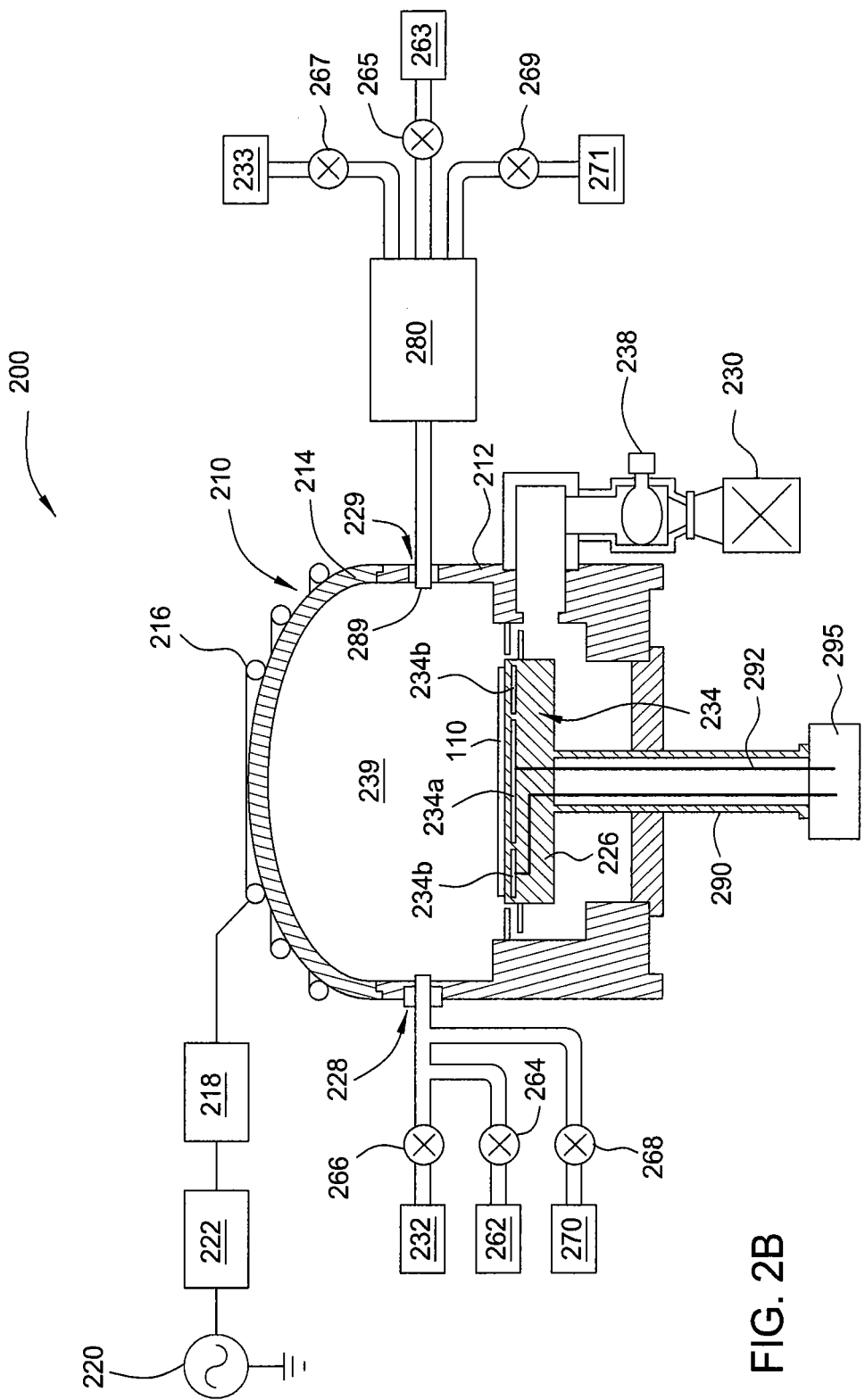
FIG. 2B is a schematic, cross-sectional view of a reactor according to another embodiment.

FIG. 2B is a schematic, cross-sectional view of the reactor 200 according to another embodiment. The reactor 200 depicted in FIG. 2B is identical to the reactor 200 in FIG. 2A, except for the positioning of the gas injection system 229. Whereas the gas injection system 229 depicted in FIG. 2A is positioned to introduce plasma from the remote plasma source 280 into the processing region 239 through the ceiling 214 of the chamber 210, the gas injection system 229 depicted in FIG. 2B is positioned to introduce plasma from the remote plasma source 280 into the processing region 239 through the single orifice 289 in the side wall 212.

The oxygen containers 232, 233 may house an oxygen-containing gas, such as oxygen ($O_2$), ozone ($O_3$), nitrous oxide ($N_2O$), or nitric oxide (NO), for example. The hydrogen containers 262, 263 may house a hydrogen-containing gas, such as hydrogen ($H_2$). The nitrogen containers 270, 271 may include a nitrogen containing gas, such as nitrogen ($N_2$), ammonia ($NH_3$), or hydrazine ($N_2H_4$).

Figure 3:
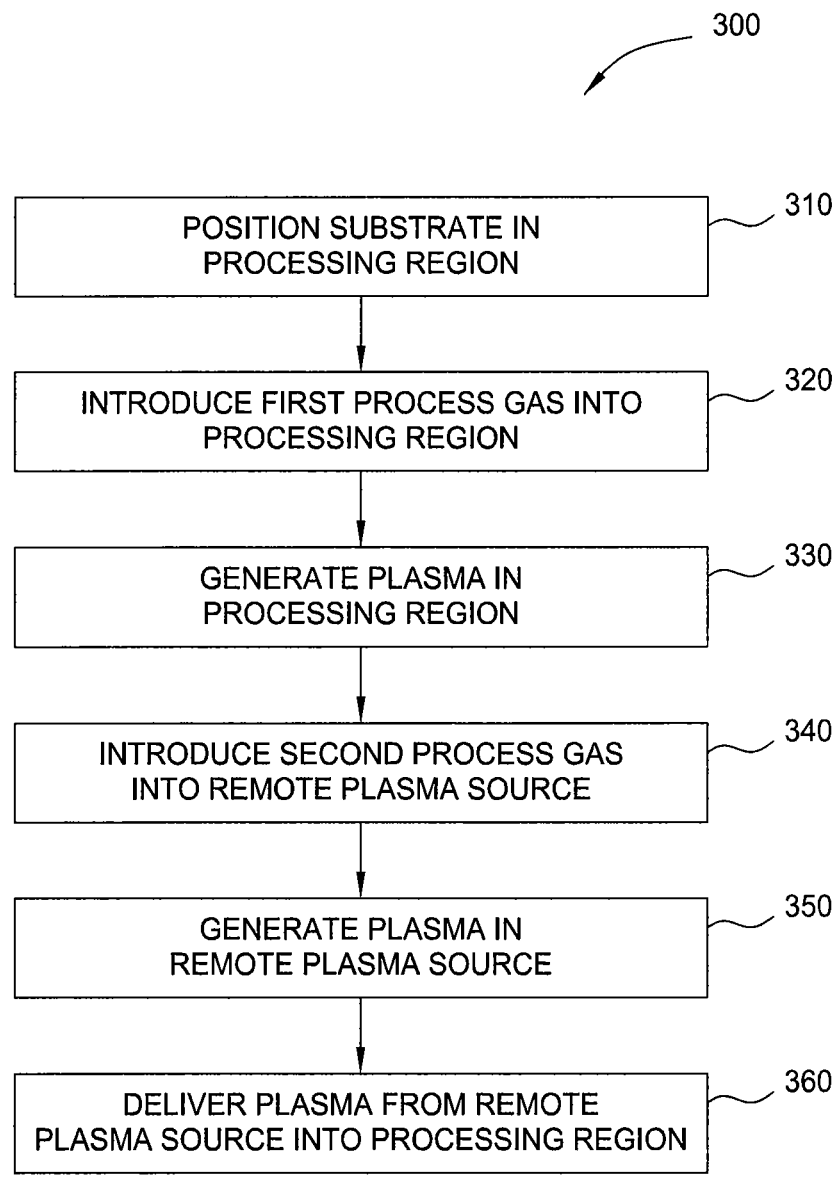
FIG. 3 is a block diagram of a process according to one embodiment.

FIG. 3 is a block diagram of a process 300 for forming a film on a substrate, such as the substrate 110, according to one embodiment of the invention. In one embodiment, the substrate 110 having features 120 formed thereon is first positioned on the substrate pedestal 226 at block 310 of the process 300. The substrate 110 may be transferred into the chamber 210 through a slit valve (not shown) positioned in the side wall 212 of the chamber 210. At block 320, a process gas may be delivered into the processing region 239 via the gas injection system 228. In an embodiment wherein an oxidation process is desired, an oxygen containing gas may be supplied from the oxygen container 232, and a hydrogen containing gas may be supplied from the hydrogen container 262. In another embodiment wherein a nitridation process is desired, a nitrogen containing gas may be supplied from the nitrogen container 270 and a hydrogen containing gas may be supplied from the hydrogen container 262. At block 330, the gas or gas mixture supplied to the processing region 239 is excited into plasma within the processing region 239 at a low pressure, such as about 500 mTorr or less.

At block 340, a process gas may be delivered to the remote plasma source 280. In an embodiment wherein an oxidation process is desired, an oxygen containing gas may be supplied from the oxygen container 233, and a hydrogen containing gas may be supplied from the hydrogen container 263. In another embodiment wherein a nitridation process is desired, a nitrogen containing gas may be supplied from the nitrogen container 271 and a hydrogen containing gas may be supplied from the hydrogen container 263. At block 350, the gas or gas mixture is excited into plasma within the remote plasma source 280 at a high pressure, such as about 1 Torr or greater.

At block 360, the plasma generated within the remote plasma source 280 is introduced into the processing region 239. Since the plasma generated within the remote plasma source 280 is generated at a high pressure, and since the number of radicals generated is extremely high compare to the number of ions generated at such high pressures, the plasma introduced from the remote plasma source 280 has an extremely high radical to ion ratio. Thus, an excess of radicals, introduced from the remote plasma source 280, is mixed with the plasma generated in the processing region 239. Further, since the pressure in the processing region 239 is at a desirably low pressure, the directionality of the ions is maintained without detrimentally influencing the directionality of the radicals in the plasma mixture. This resulting process enables changing the natural distribution of radicals to ions at a given operating pressure, further enabling tailoring of the ion to radical ratio to better control corner rounding, sidewall to bottom wall growth, and selective growth.

While the foregoing is directed to embodiments of the present invention, other and further embodiments of the invention may be devised without departing from the basic scope thereof, and the scope thereof is determined by the claims that follow.

The invention claimed is:

1. A method for forming a film on a substrate, comprising:
   generating a first plasma from a first gas in a processing region of a processing chamber at a first pressure;
   generating a second plasma from a second gas outside of the processing region at a second pressure;
   introducing a flow of the second plasma into the processing region to mix with the first plasma; and
   heating the substrate positioned on a substrate support within the processing region.

2. The method of claim 1, wherein the first pressure is lower than the second pressure.

3. The method of claim 2, wherein the first pressure is about 500 mTorr or less.

4. The method of claim 3, wherein the second pressure is at least about 1 Torr.

5. The method of claim 2, wherein the first plasma is generated inductively.

6. The method of claim 5, wherein the second plasma is generated by a remote plasma source.

7. The method of claim 2, wherein the second plasma is introduced into the processing region through a single orifice.

8. The method of claim 2, wherein the second plasma is introduced into the processing region through a gas distribution plate.

9. The method of claim 2, wherein the substrate is heated to at least about 500° C.

10. The method of claim 2, further comprising rotating the substrate within the processing region.

11. A reactor for forming a film on a substrate, comprising:
    a processing chamber having a lid, a sidewall, and a substrate support positioned to form a processing region, wherein the substrate support includes a heater configured to heat a substrate disposed on the substrate support to a temperature of at least about 500° C.;
    a gas source coupled to the chamber and configured to deliver a process gas to the processing region;
    an RF source coupled to the processing chamber and configured to generate a first plasma of the process gas in the processing region;
    a remote plasma source coupled to the chamber and configured to deliver a second plasma generated at a first pressure to the processing region to mix with the first plasma; and
    a vacuum pump coupled to the processing chamber and configured to maintain the processing region at a second pressure, wherein the first pressure is greater than the second pressure.

12. The reactor of claim 11, wherein the second plasma is delivered to the processing region through a single orifice.

13. The reactor of claim 11, further comprising a showerhead positioned in the processing chamber, wherein the second plasma is delivered to the processing region through the showerhead.

14. The reactor of claim 11, further comprising an actuator coupled to the substrate support and configured to rotate the substrate support during processing.

15. The reactor of claim 11, wherein the second pressure is about 500 mTorr or less.

16. The reactor of claim 15, wherein the first pressure is at least about 1 Torr.

\* \* \* \* \*